United States Patent
Bilger et al.

(10) Patent No.: US 8,120,958 B2
(45) Date of Patent: Feb. 21, 2012

(54) MULTI-DIE MEMORY, APPARATUS AND MULTI-DIE MEMORY STACK

(75) Inventors: Christoph Bilger, Munich (DE); Peter Gregorius, Munich (DE); Michael Bruennert, Munich (DE); Maurizio Skerlj, Munich (DE); Wolfgang Walthes, Munich (DE); Johannes Stecker, Munich (DE); Hermann Ruckerbauer, Moos (DE); Dirk Scheideler, Munich (DE); Roland Barth, Munich (DE)

(73) Assignee: Qimonda AG, Munich (DE)

( * ) Notice: Subject to any disclaimer, the term of this patent is extended or adjusted under 35 U.S.C. 154(b) by 163 days.

(21) Appl. No.: 11/963,972

(22) Filed: Dec. 24, 2007

(65) Prior Publication Data
US 2009/0161401 A1    Jun. 25, 2009

(51) Int. Cl.
*G11C 11/34*    (2006.01)

(52) U.S. Cl. .................................................. 365/185.11
(58) Field of Classification Search ............. 365/185.11
See application file for complete search history.

(56) References Cited

U.S. PATENT DOCUMENTS

| | | | |
|---|---|---|---|
| 6,754,746 B1 * | 6/2004 | Leung et al. | 710/100 |
| 2004/0148551 A1 * | 7/2004 | Kawahara | 714/48 |
| 2005/0195661 A1 * | 9/2005 | Conley | 365/189.05 |
| 2007/0162685 A1 * | 7/2007 | Suh | 711/100 |
| 2009/0059641 A1 * | 3/2009 | Jeddeloh | 365/63 |

* cited by examiner

*Primary Examiner* — Hoai V Ho
*Assistant Examiner* — Anthan Tran
(74) *Attorney, Agent, or Firm* — John S. Economou

(57) ABSTRACT

The multi-die memory comprises a first die and a second die. The first die comprises a first group of memory banks, and the second die comprises a second group of memory banks. The first group of memory banks and the second group of memory banks are coupled to a common memory interface. The common memory interface couples the multi-die memory with an internal connection.

13 Claims, 10 Drawing Sheets

MULTI-DIE MEMORY, APPARATUS AND MULTI-DIE MEMORY STACK

TECHNICAL FIELD

Embodiments described herein relate to a multi-die memory, an apparatus and a multi-die memory stack.

Some embodiments described herein relate to a bank group aligned array stack.

BRIEF DESCRIPTION OF THE DRAWINGS

For a more complete understanding of the present invention, and the advantages thereof, reference is now made to the following descriptions taken in conjunction with the accompanying drawing, in which:

FIG. 2b shows a schematic representation of a die which can be used in the multi-die memory shown in FIG. 2a;

FIG. 5b shows a schematic representation of a die, which can be used in the multi-die memory shown in FIG. 5a;

FIG. 7b shows a schematic representation of a first type of die which can be used in the multi-die memory shown in FIG. 7a;

FIG. 7c shows a schematic representation of a second type of die which can be used in a multi-die memory shown in FIG. 7a;

FIG. 8b shows a schematic representation of a die, which can be used in a multi-die memory shown in FIG. 8a.

DETAILED DESCRIPTION OF ILLUSTRATIVE EMBODIMENTS

Figure 1:
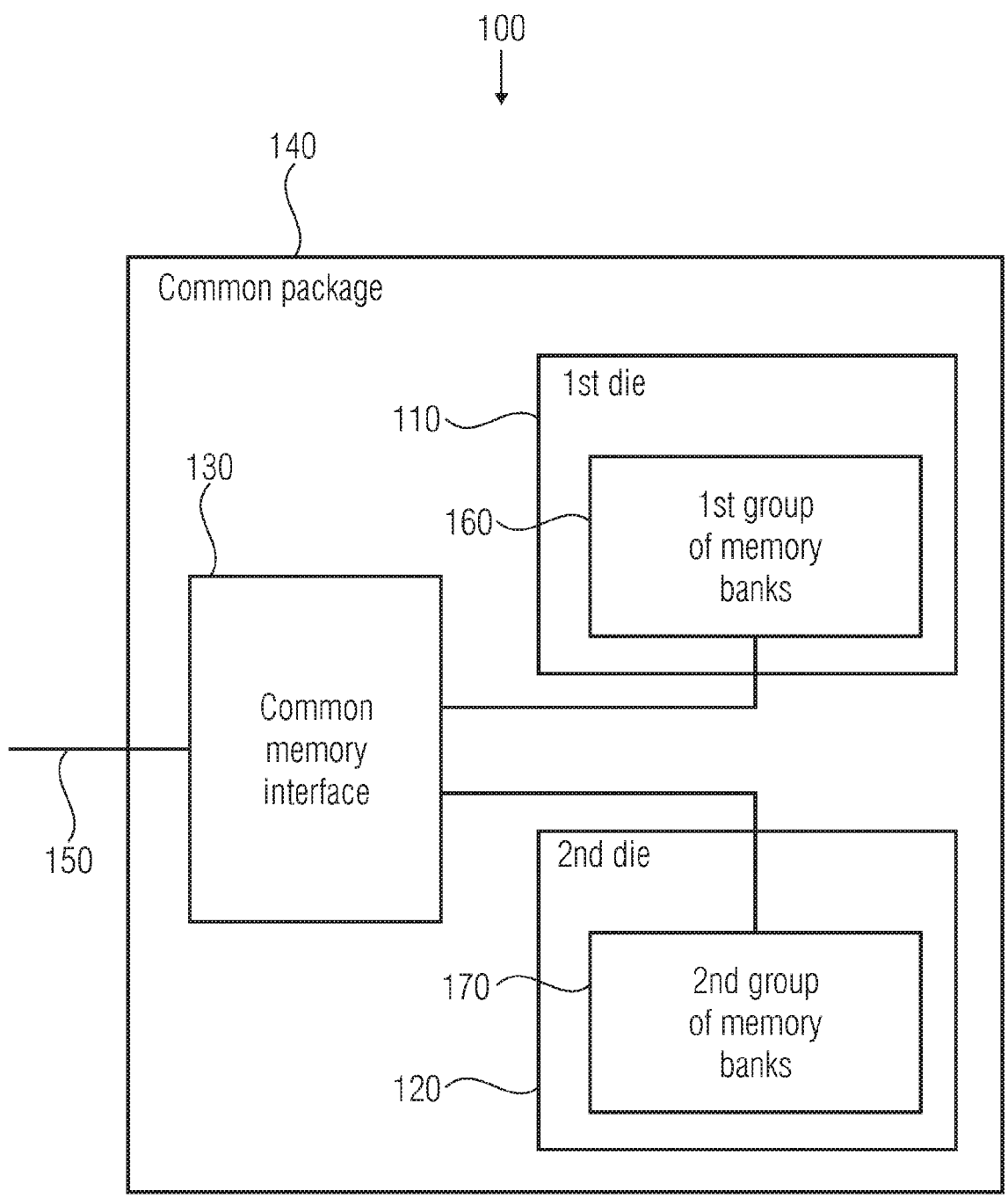
FIG. 1 shows a block schematic diagram of a multi-die memory, according to an embodiment.

FIG. 1 shows a block schematic diagram of a multi-die memory, according to an embodiment. The memory shown in FIG. 1 is designated in its entirety with 100.

The multi-die memory 100 comprises a first die 110 and a second die 120. Moreover, the multi-die memory 100 comprises a common memory interface 130. The first die 110, the second die 120 and the common memory interface 130 are arranged in a common package 140.

The multi-die memory 100 comprises an external connection 150, which may, for example, provide a connection between the components arranged within the common package 140 and an external environment outside of the common package 140.

The first die 110 comprises a first group 160 of memory banks. The second die 120 comprises a second group 170 of memory banks.

The first group 160 of memory banks and the second group 170 of memory banks are both coupled to the common memory interface 130. The common memory interface 130 is configured to couple the first group 160 of memory banks and the second group 170 of memory banks with the external connection 150.

According to some embodiments according to the invention described herein, the multi-die memory comprises at least two groups 160, 170 of memory banks, which are also designated as "bank group". According to some embodiments, the at least two bank groups are distributed to different dice, which are placed in a common package or in a common housing. Nevertheless, the different groups 160, 170 of memory banks may for example share the common memory interface 130. Thus, from an environment outside of the common package 140, the multi-die memory 100 may, according to some embodiments according to the invention, appear as a single memory unit or as a monolithic memory unit. According to some embodiments according to the invention, the common memory interface 130 may concentrate any connections of the groups 160, 170 of memory banks to the single external connection 150.

According to some embodiments according to the invention, a distribution of different groups 160, 170 of memory banks to different dice 100, 120 may, for example, provide a certain degree of flexibility with respect to a routing of signals between the common memory interface 130 and the groups 160, 170 of memory banks. According to some embodiments according to the invention, an overall die size of a multi-die memory described herein may be smaller when compared to a memory comprising a plurality of groups of memory arrays arranged on a single die. According to some further embodiments according to the invention, a performance improvement may be achieved by distributing different groups 160, 170 of memory banks to different dice 110, 120. According to some embodiments according to the invention, the distribution of the groups 160, 170 of memory banks may for example allow for an increase of a data rate on some data connections within the common package 140.

According to some embodiments according to the invention, the common package may comprise a sealing compound. Alternatively, a chip scale package, a wafer level chip scale package or a wafer level package may be used. However, other types of packages may be used, which are well known to men skilled in the art.

According to some embodiments according to the invention, a (die-to-die) data path connecting at least one of the memory groups to the common memory interface or a (die-to-die) data path connecting the memory groups may be routed vertically, for example approximately perpendicular to main surfaces of the dice, which may allow for a saving of chip area in some embodiments according to the invention. For example, a direction of said die-to-die data path may exhibit an angle in the range between 70 degree and 90 degree with a main surface of the dies.

In the following, some embodiments according to the invention will be described, which may bring along some further improvements of the concept described herein. Nevertheless, the embodiments should be considered to be merely exemplary.

Figure 2A:
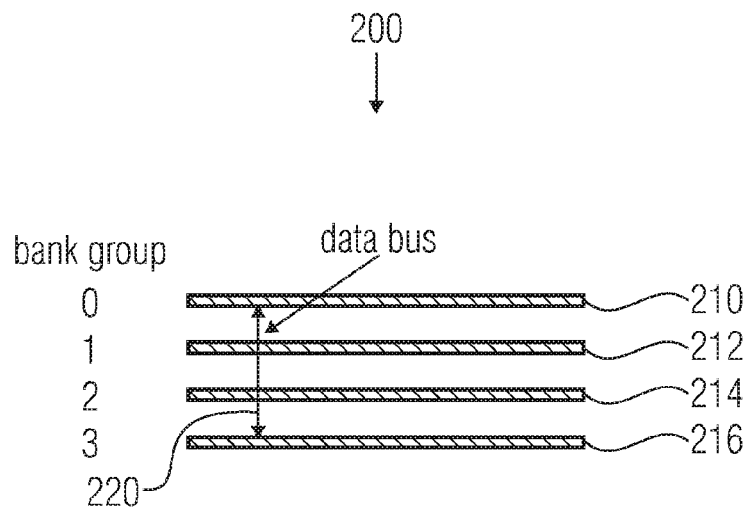
FIG. 2a shows a schematic cross-sectional representation of a multi-die memory, according to an embodiment.

FIG. 2a shows a schematic cross-sectional representation of a multi-die memory, according to an embodiment. The multi-die memory shown in FIG. 2a is designated in its entirety with 200. The multi-die memory 200 comprises a stack of single dice 210, 212, 214, 216. The stacked dice 210, 212, 214, 216 are shown as distinct, spaced dice in the cross-sectional representation of FIG. 2a. Nevertheless, the dice may for example be directly attached to each other or stacked on top of each other.

In an embodiment according to the invention, the first die 210 may be a die without a bank group sub-structure, as will be explained in the following. In some embodiments, the die 210 constitutes a single bank group, so that it has the structure of a bank group. In some embodiments, the die 210 may not have a sub-structure consisting of bank groups. Also, the second die 212 may be a single die without a bank group sub-structure. The third die 214 may also be a single die without a bank group sub-structure, and the fourth die 216 may also be a single die without a bank group sub-structure. Moreover, in an embodiment according to the invention there is an inter-die connection between the single dice 210, 212, 214, 216, for example a data bus connecting the single dice 210, 212, 214, 216. The data bus 220 may for example form a "vertical connection" which may for example be approximately perpendicular to a main surface of the single dice 210, 212, 214, 216. For example, the data bus 220 may comprise through-substrate vias or through-silicon vias (TSV).

According to an embodiment, the first single die 210 may comprise a first bank group (also designated as "bank group 0"). The second single die 212 may comprise a second bank group (also designated as "bank group 1"). The third single die 214 may comprise a third bank group (also designated as "bank group 2"), and the fourth single die 216 may comprise a fourth bank group (also designated as "bank group 3"). In an embodiment according to the invention, each of the single dice 210, 212, 214, 216 comprises only a single bank group. However, other embodiments are possible. For example, each die may comprise a plurality of decoupled bank groups, which do not share a common data path on the die.

In the following, an exemplary single die will be described. For this purpose, FIG. 2b shows a block schematic diagram of a die, which can be used in the multi-die memory 200 shown in FIG. 2a.

Figure 2B:
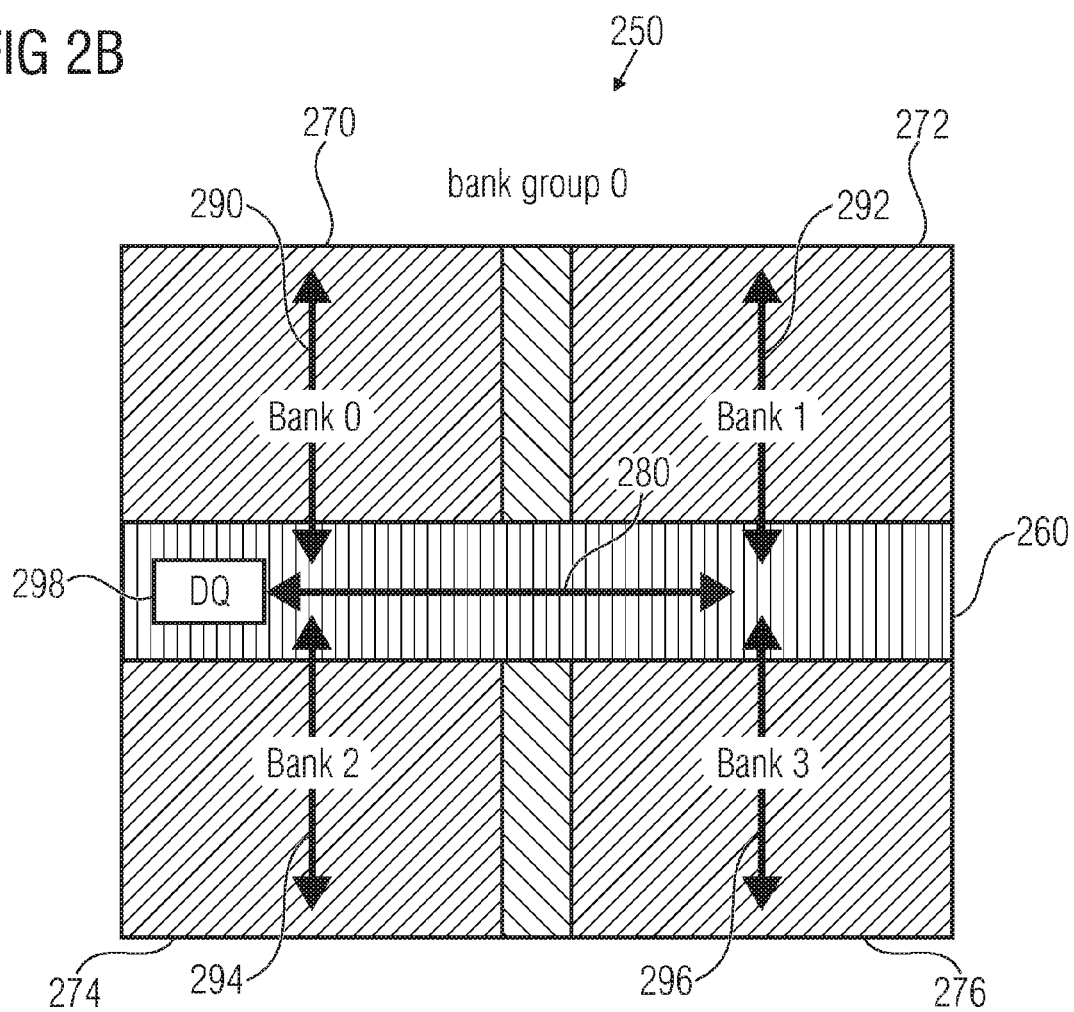

The die shown in FIG. 2b is designated in its entirety 250. The die 250 comprises a spine 260 or spine area 260 and a plurality of banks coupled to the spine 260. In an embodiment according to the invention, the die 250 comprises a first bank 270 (also designated as "bank 0"), a second bank 272 (also designated as "bank 1"), a third bank 274 (also designated as "bank 2") and a fourth bank 276 (also designated as "bank 3").

In an embodiment, the spine 260 is arranged in a central portion of the die 250, embedded between two or more banks 270, 272, 274, 276. The spine 260 comprises a shared data bus 280, which is configured to communicate, on shared lines, for example in a time-multiplexed way, data for at least two different banks 270, 272, 274, 276. The shared data bus 280 may in some embodiments be a bank-group internal data bus, which may be coupled to an inter-bank-group data bus via a data gate, such that the shared (or common) data bus 280 may be alternatively (or selectively) coupled to the inter-bank group data bus to receive data from the inter-bank group data bus or to provide data to the inter-bank group data bus or isolated from the inter-bank group data bus. The die 250 may further comprise bank group data buses 290, 292, 294, 296, which may for example be configured for a unidirectional or bidirectional data exchange between the common (e.g., bank group internal) data bus 280 and the individual banks 270, 272, 274, 276. For example, a first bank data bus 290 may be configured to receive data from the common data bus 280 and to provide data to the first bank 270. For example, the first bank data bus 290 may be coupled to the common data bus 280 via a data gate. Similarly, the second bank data bus 292 may be coupled to the common data bus 280 via a data gate. Thus, according to some embodiments, the data gates between the common data bus 280 and the bank data buses 290, 292, 294, 296 can be configured such that different data may be present on the bank data buses 290, 292, 294, 296 at a given point in time. However, in another embodiment according to the invention, the bank data buses 290, 292, 294, 296 may all be directly coupled to the common (e.g., bank group internal) data bus 280, such that identical data are present on the bank data buses 290, 292, 294, 296.

According to an embodiment according to the invention the banks 270, 272, 274, 276 are configured such that memory rows in different of the banks can be opened individually. For example, according to an embodiment a memory row (e.g., of a memory array) in the first bank 270 can be opened (or activated) independently of an activation of a row of the second bank 272. Thus, a particularly high memory access speed can be obtained in some embodiments by individually opening memory rows of different memory banks.

The die 250 may further comprise a data interface 298, which may for example be configured for connecting the common data bus 280 to an external environment of the die 250. In an embodiment according to the invention, the data interface 298 may for example comprise input/output drivers connected to an external connection (for example, to a bond pad) of the die 250. Moreover, the data interface 298 may, for example, be configured to provide a coupling between an external connection and an inter-group data bus, for example the data bus 220. In an embodiment according to the invention, the data interface 298 may comprise a unidirectional or bidirectional driver circuited between the external connection and an inter-group data bus or inter-die data bus. The inter-die (or inter-bank-group) data bus may, for example, comprise through-substrate vias or through-silicon vias, as described above, to allow for a coupling between two stacked dice. Also, the die 250 may for example comprise a coupling (e.g., in the form of a data gate) between a portion of the inter-bank group data bus 220 and the bank-group-internal data bus 280.

In an embodiment according to the invention, the single dice 210, 212, 214, 216 may be identical. In an embodiment according to the invention, each of the single dice 210, 212, 214, 216 may comprise the full interface structure of the interface 298. In other words, each of the individual dice 210, 212, 214, 216 may comprise an external connection. However, in some embodiments according to the invention, the interface 298 and/or the external connection may be deactivated at least partially for at least one of the single dice 210, 212, 214, 216 forming the multi-die memory. In some embodiments according to the invention, the external connection may indeed only be active for a single of the individual dice 210, 212, 214, 216, which may, for example, be reached by an appropriate configuration of the dice 210, 212, 214, 216 (for example, by appropriately programming some volatile or non-volatile memory element, or by appropriately configuring a bond wire).

In an embodiment according to the invention, the die 250 may for example comprise a memory density of 1 Gigabit (1 Gb).

In some embodiments according to the invention, the inter-bank group data bus 220 may be configured to support a higher data rate than the bank-group-internal data bus 280. In an embodiment according to the invention, a physical length of a bus line of the inter-bank group data bus 220 may, for example, be shorter than a physical length of a bus line of the bank-group-internal data bus 280. Thus, in some embodiments according to the invention the inter-bank group data bus 220 may be configured to transport, for example via one or more shared bus lines, data for different bank groups. Also, according to some embodiments according to the invention the inter-bank group data bus 220 may be configured to support or to be operated at a higher data rate than the bank-group-internal data bus 280.

In some embodiments according to the invention, paths in a spine (e.g., in a spine 260 of a die 250) are in parallel for different bank groups. For example, a bank-group-internal data path (e.g., the data bus 280) of the first die 210 may be in parallel (e.g., electrically parallel and/or physically parallel) to a bank-group-internal data path of the second die 212. For example, the bank-group-internal data path (or data paths) of different dice 210, 212, 214, 216 may be coupled, for example via a data gate, to a common inter-bank-group data path, but may be electrically separated in such a way that the bank-group-internal data paths are able to carry independent data values. In other words, in some embodiments according to the invention the paths in the spine (e.g., in the spine 260) may be in parallel and not shared for the different bank groups. In some embodiments according to the invention, there is an (additional) shared path (for example the inter-bank group data bus 220), which may be for example comprise through-substrate vias or through-silicon vias (TSV). In some embodiments according to the invention, the additional shared path may be fast enough to allow a required speed for consecutive accesses to different bank groups.

In the following, details of some embodiments according to the invention will be described taking reference to FIGS. 3 and 4.

Figure 3:
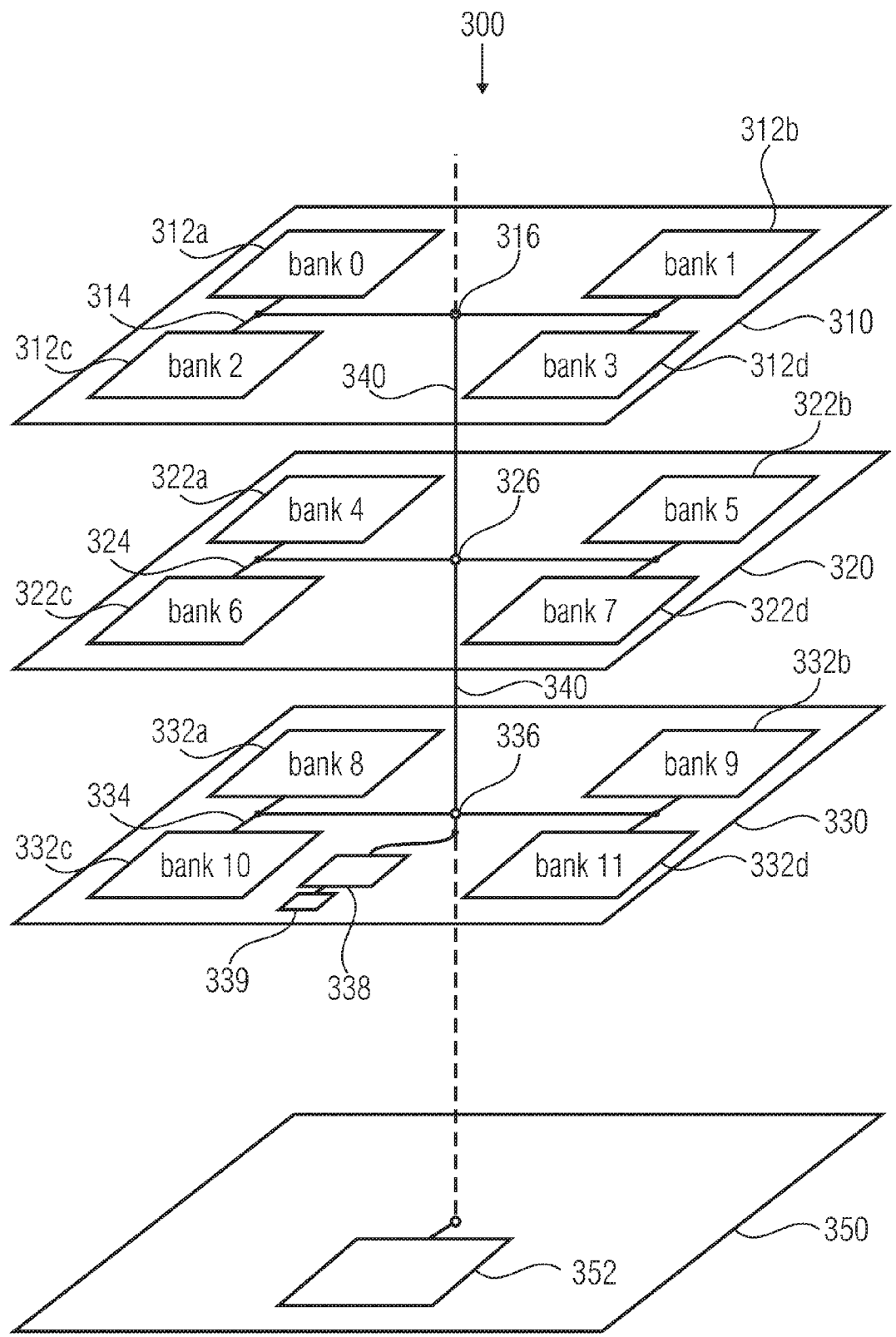
FIG. 3 shows a block schematic diagram of a multi-die memory, according to an embodiment.
Figure 4:
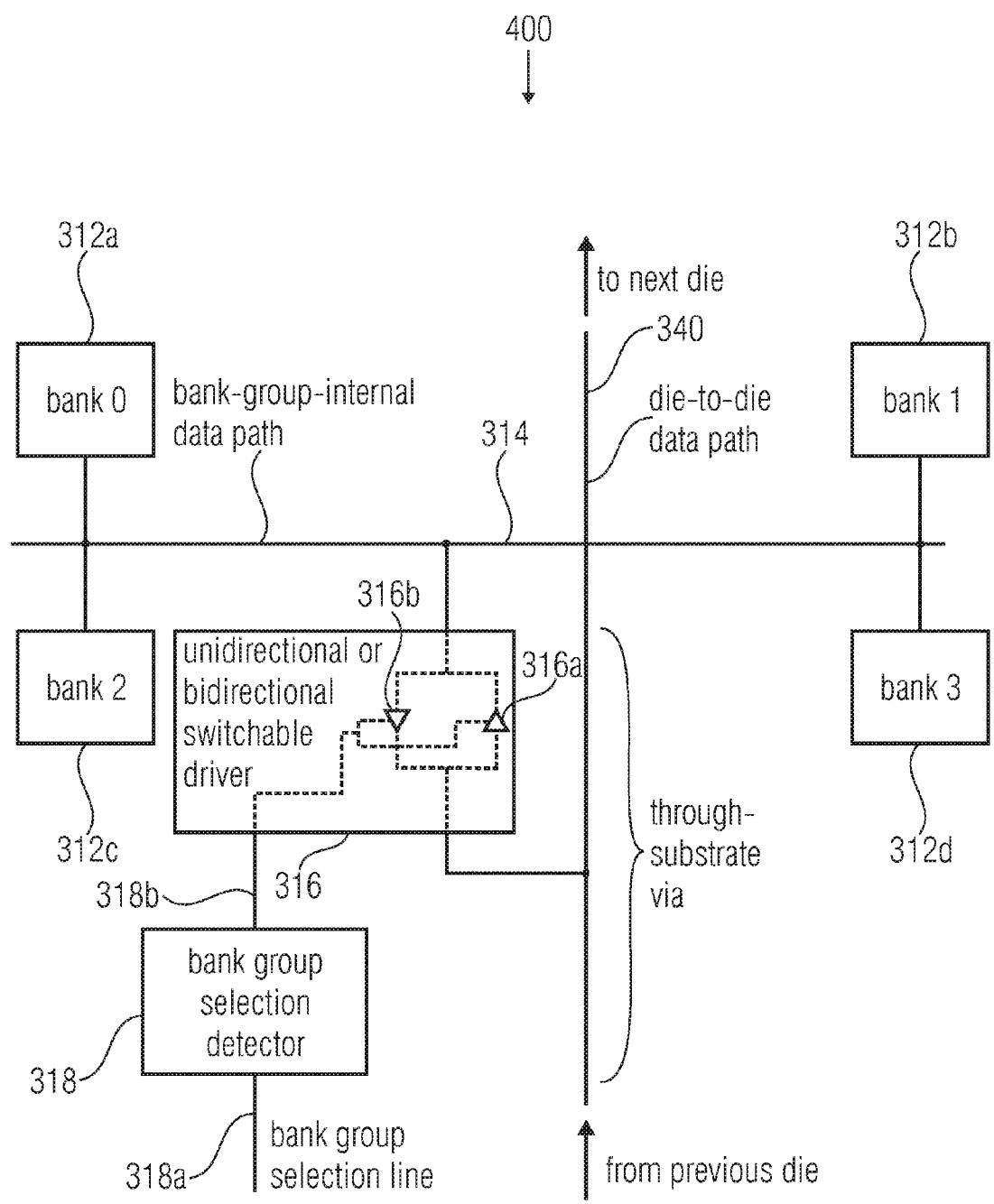
FIG. 4 shows an extract from a block schematic diagram of a die, which can be used in the embodiment shown in FIG. 3.

FIG. 3 shows a block schematic diagram of a multi-die memory, according to an embodiment.

The multi-die memory of FIG. 3 is designated in its entirety with 300. The multi-die memory 300 comprises a first die 310, a second die 320, and a third die 330. The first die 310, the second die 320 and the third die 330 may, for example, be stacked to form a multi-die stack. In an embodiment, the first die 310 may comprise a group of memory banks, also designated briefly as "bank group". Similarly, the second die 320 may also comprise a group of memory banks. In an embodiment, the third die 330 may similarly comprise a group of memory banks. In an embodiment according to the invention, the dice 310, 320, 330 may comprise an identical hardware, which may, however, be configured for different functionalities by adding one or more bond wires or by storing different configuration information in one or more memory elements.

In an embodiment according to the invention, each of the dice 310, 320, 330 may comprise a single group of memory banks.

In an embodiment according to the invention the first die 310 comprises a plurality of memory banks, for example 2, 4, 8, 16 or 32 memory banks. However, other numbers of memory banks per die may be used. In the embodiment shown in FIG. 3, the first die 310 comprises four memory banks, namely a first memory bank 312a (designated as "bank 0"), a second memory bank 312b (designated as "bank 1"), a third memory bank 312c (designated as "bank 2") and a fourth memory bank 312d (designated as "bank 3"). The memory banks 312a to 312d of the first die 310 may, for example, be coupled to a die-internal or bank-group-internal data bus 314. It should be noted here that die-internal data bus or bank-group-internal data bus 314 may be configured to provide address data and/or write data and/or control data (like, for example, control signals) to the memory banks 312a, 312b, 312c, 312d. Besides, the die-internal data bus or bank-group-internal data bus 314 may optionally be configured to receive read data and/or control data from the memory banks 312a to 312d. Thus, it should be noted that the term "data bus" is used herein in a broad sense. For example, the term "data" is used to designate address data and/or read data and/or write data and/or control data.

The second die 320 may, for example, comprise four memory banks forming a group of memory banks. For example, the second die 320 may comprise a fifth bank 322a ("bank 4"), a sixth bank 322b ("bank 5"), a seventh bank 322c ("bank 6") and an eight bank 322d ("bank 7"). The banks 322a to 322d (e.g., two banks, four banks as shown in FIG. 3, eight banks, sixteen banks, or another number of banks) may form a bank group, and may be coupled to a bank-group-internal data bus or die-internal data bus 324.

The third die 330 may be configured similar like the second die 320. For example, the third die 330 may comprise a ninth bank 332a ("bank 8"), a tenth bank 332b ("bank 9"), an eleventh bank 332c ("bank 10") and a twelfth bank 332d ("bank 11"). The banks 332a to 332d of the third die 330 may be coupled to a bank-group-internal data bus 334 or die-internal data bus of the third die 330.

In an embodiment according to the invention, the die-internal data bus 314 of the first die 310 is coupled to an inter-die data bus or inter-bank-group data bus 340 via a coupling circuit 316, which may, for example, be arranged on the first die 310. The die-internal data bus 324 of the second die 320 may for example be coupled to the inter-die data bus or inter-bank-group data bus 340 via a coupling circuit 326, which may for example be arranged on the second die 320. The die-internal data bus 334 of the third die 330 may, for example, be coupled with the inter-die data bus 340 via a coupling circuit 346.

At least one of the dice 310, 320, 330, for example the third die 330, may comprise an interface circuit 338, which may be configured to provide for a coupling between an external environment of the multi-die memory 300 and the inter-die data bus 340. For example, the interface circuit 338 may be connected between an external connection (e.g., one or more bond pads 339, or another type of external connection) and the inter-die data bus 340. For example, the interface circuit 338 may be configured to conciliate an external memory interface timing to an internal interface timing on the inter-die data bus 340. For example, the interface circuit 338 may comprise a decoder which of the bank group should be addressed in dependence on an address provided by the external connection of the multi-die memory. Also, the interface circuit 338 may, for example, be configured to combine data received from the different bank groups into a single data burst. Also, the interface circuit 338 may be configured to coordinate the bank groups such that only one of the bank groups provides data to the inter-die data bus 340 at one time.

It should be noted that in some embodiments of a multi-die memory, each of the dice 310, 320, 330 may comprise an interface circuit (for example, an interface circuit having the functionality of the interface circuit 338). However, in some the dice this interface circuit may be deactivated. However, there are other embodiments in which only one out of the dice 310, 320, 320 forming the multi-die memory comprises an interface circuit. In such an embodiment, the total die size of those dice not comprising the interface circuit may be smaller than a die size of the one or more dice comprising the interface circuit. Thus, costs may be reduced by providing the interface circuit on only one of the dice forming the multi-die memory.

In another embodiment according to the invention, a dedicated interface die 350 may be provided which comprises an interface circuit 352. An interface circuit 352 of the dedicated interface die 350 may for example be coupled to the inter-die data bus 340, as shown. Nevertheless, the presence of the dedicated interface die 350 may be considered as optional. In the presence of the dedicated interface die 350, the dice 310, 320, 330 comprising the bank groups may be interface-less dice. Thus, in an embodiment according to the invention the multi-die memory may be configured such that the dedicated interface die 350 is the only die comprising an interface 352 for providing a coupling to an environment outside of the multi-die memory or multi-die stack or outside of the housing thereof (for example under normal operating conditions).

In some embodiments according to the invention, the inter-die data bus may be directed at least approximately perpendicular to main surfaces of the dice 310, 320, 330, 350. In some embodiments according to the invention, the inter-die data bus 340 may comprise one or more through-substrate vias or through-silicon vias. For example, a connection between the first die 310 and the third die 330 may be established using a through-substrate via formed in or on the second die 320.

In the following, the function of a single one of the dice 310, 320, 330 of the multi-die memory 300 will be described taking reference to FIG. 4. FIG. 4 shows a block schematic diagram of a die, according to an embodiment. The die shown in FIG. 4 is designated in its entirety with 400. For example, the die 400 shown in FIG. 4 may be identical the first die 310 shown in FIG. 3. Therefore, identical means are designated with identical reference numerals in FIGS. 3 and 4. The die 400 comprises a plurality of banks (i.e. at least two banks), for example a first bank 312a, a second bank 312b, a third bank 312c and a fourth bank 312d. The die 400 comprises a bank-group-internal data path or bank-group-internal data bus 314. The die 400 also comprises a portion of the inter-die data bus 340, which is also designated as die-to-die data path or die-to-die data bus. As outlined above, the inter-die data bus 340 may for example comprise a through-substrate via or through-silicon via, as indicated in FIG. 4.

The die 400 may further, for example, comprise a coupling circuit 316 connected between the bank-group-internal data path 314 and the inter-die data path (or inter-die data bus) 340. The coupling circuit 316 may, for example, comprise a unidirectional or bidirectional switchable driver. Alternatively, the coupling circuit may comprise another transmission means, for example a transmission gate. The unidirectional or bidirectional switchable driver may for example, optionally, comprise a latch for storing and retaining data. In an embodiment according to the invention, the coupling circuit may comprise a driver 316a (which may optionally comprise an additional latch) configured to receive data from the inter-die data bus 340 and to provide the received data, in an active mode of operation, to the bank-group-internal data path 314. Nevertheless, said driver 316a may be configured to isolate the bank-group-internal data path 314 from the inter-die data bus 340 in an inactive mode of operation. Thus, said driver 316a may, for example, be configured to selectively forward data from the inter-die data bus 340 to the bank-group-internal data path 314.

In an embodiment according to the invention, the coupling circuit 316 may comprise a second driver 316b configured to selectively forward data from the bank-group-internal data path 314 to the inter-die data bus 340. For example, said second driver 316b, which may for example comprise an (optional) latch, may be configured to forward data from the bank-group-internal data path 314 to the inter-die data bus 340 in an active mode of operation, and to isolate the bank-group-internal data path 314 from the inter-die data bus 340 in an inactive mode of operation.

The die 400 may comprise a bank group selection detector 318, which may be configured to receive the bank group selection signal, for example via one or more bank group selection lines 318a. Moreover, the bank group selection detector 318 may be configured to detect when the bank group of the die 400 is selected for data transfer via the inter-die data bus 340. If the bank group (for example, comprising the banks 312a to 312d) is selected for a data transfer, the bank group selection detector may provide a driver activation signal 318b to the coupling circuit 316 in order to activate the first driver 316a and/or the second driver 316b. Otherwise, for example when a different bank group (for example of a different die) is selected for a data transfer via the inter-die data bus 340, the bank group selection detector 318 may deactivate the coupling circuit 316.

To summarize the above, in an embodiment according to the invention the bank-group-internal data path or bank-group-internal data bus 314 is coupled to the inter-die data bus or to the die-to-die data path via the coupling circuit 316, such that data can be forwarded, in an active state of the coupling circuit 316, from the inter-die data bus 340 to the bank-group-internal data path 314, or from the bank-group-internal data path 314 to the inter-die data bus 340. In addition, the coupling circuit 316 may be configured to electrically isolate the bank-group-internal data path 314 from the inter-die data bus 340 in an inactive state of operation.

According to some embodiments, the inter-die data bus 340 can therefore be shared by a plurality of bank groups arranged on different dice.

Figure 5A:
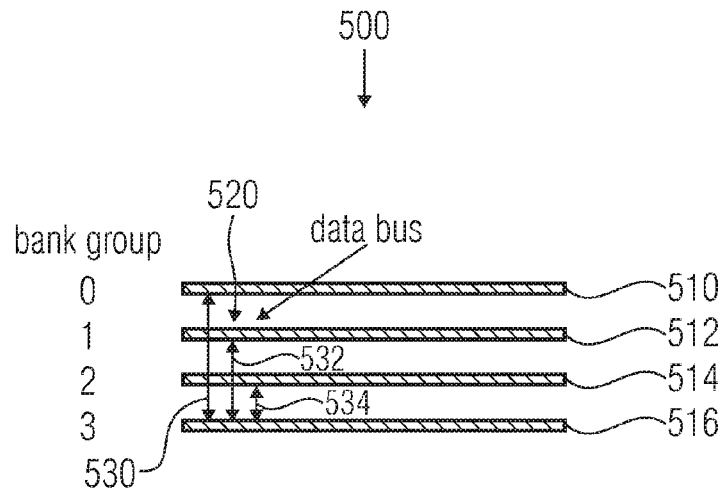
FIG. 5a shows a schematic cross-sectional representation of a multi-die memory, according to an embodiment.

In the following, some other embodiments according to the invention will be described in which a different concept for connecting the individual bank groups is used. FIG. 5a shows a schematic cross-sectional representation of a multi-die memory, according to an embodiment according to the invention. The multi-die memory shown in FIG. 5a is designated in its entirety with 500. The multi-die memory 500 comprises a plurality of single dice, which may for example be stacked to form a multi-die stack. In the embodiment according to the invention shown in FIG. 5a, there are four stacked single dice. However, any other number of dice could be used to form a multi-die stack. For example, two single dice, four single dice, eight single dice or sixteen single dice could be used. For example, the multi-die memory 500 may comprise a first die or single die 510, a second die or single die 512, a third die or single 514 and a fourth die or single die 516. The first die or single die 510 may be, for example, a die without a bank group sub-structure. The second die or single die 512 may for example be a die without a bank group sub-structure. The third die or single die 514 may for example be a die without a bank group sub-structure. The fourth die or single die 516 may for example be a die without a bank group sub-structure. Thus, in some embodiments according to the invention, the first die or single die 510 may comprise a single bank group. The second die 512 may also comprise a single bank group. The third die 514 may comprise another single bank group, and the fourth die 516 may comprise another single bank group. In an embodiment according to the invention, the first die 510 may comprise a first bank group ("bank group 0"), the second die 512 may comprise a second bank group ("bank group 1"), the third die 514 may comprise a third bank group ("bank group 2"), and the fourth die 516 may comprise a fourth bank group ("bank group 3"). In an embodiment according to the invention, the multi-die memory 500 may comprise an inter-die connection 520, which may, for example, be in the form of a data bus. The data bus or inter-die connection 520 may, for example, comprise through-substrate vias or through-silicon vias (TSV). For example, the inter-die connection (also designated as die-to-die connection) may comprise a plurality of individual connections, as will be explained in detail in the following.

In an exemplarily embodiment, the inter-die connection or die-to-die connection 520 comprises a first die-to-die connection 530 connecting the first die 510 to the fourth die 516. Moreover, the multi-die memory 500 comprises a second die-to-die connection 532 connecting the second die 512 to the fourth die 516. Besides, the multi-die memory 500 may comprise a third die-to-die connection 534 connecting the third die 514 to the fourth die 516.

However, it should be noted that the presence of three die-to-die connections is not required. In contrast, there are some embodiments according to the invention in which there are only two die-to-die connections. For example, in an alternative embodiment according to the invention, there may be at least three dies. A first die-to-die connection may connect a first die to a third die, and a second die-to-die connection may connect a second die to the third die. Also, it should be noted that the numbering of the dice presented here is chosen arbitrarily. In other words, the numbering of the dice does not comprise an information about a physical arrangement or sequence of the dice. However, in an embodiment according to the invention, an i-th die may be adjacent, for example in a die stack, to an (i−1)-th die, wherein i is an integer number. In an alternative embodiment according to the invention, an i-th die may be arranged between a (i−1)-th die and an (i+1)-th die.

In an embodiment according to the invention, the die-to-die connections may be separate, as will be discussed in more detail in the following.

Figure 5B:
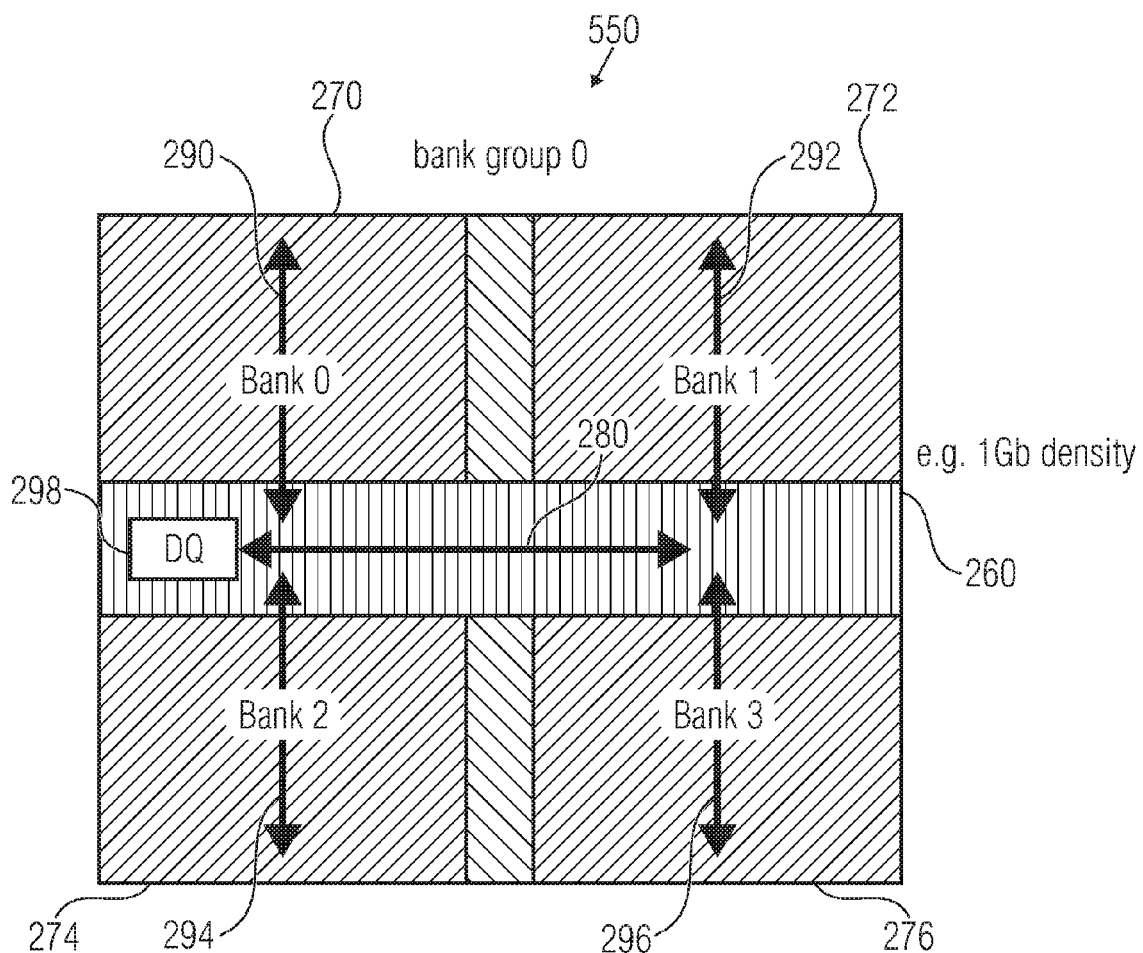

Taking reference to FIG. 5b, an exemplary structure of the dice 510, 512, 514, 516 will be described. For this purpose, FIG. 5b shows a block schematic diagram of a die, according to an embodiment according to the invention. The die shown in FIG. 5b is designated in its entirety with 550. It should be noted that the die 550 may be very similar to the die 250 described with reference to FIG. 2. Therefore, identical means are designated with identical reference numerals and will not be explained here again.

Apart from the features already described with reference to the die 250, the die 550 may comprise a modified interface 598 for coupling the bank-group-internal data bus (also designated as die-internal data bus, or die-internal data path) 280 with another die and/or with an external environment of the multi-die memory. According to some embodiments according to the invention, the multi-die memory 500 may be identical to (or very similar to) the multi-die memory 200, except that the data bus between different dice is separated for each die. In an embodiment according to the invention, an even higher speed capability can be reached in the multi-die memory 500 for consecutive accesses to different groups (for example when compared to a multi-die memory 200). However, according to some embodiments according to the invention, a larger die size may be required to implement the multi-die memory 500 (for example when compared to the multi-die memory 200) due to additional through-substrate vias or through-silicon vias (TSV).

Figure 6:
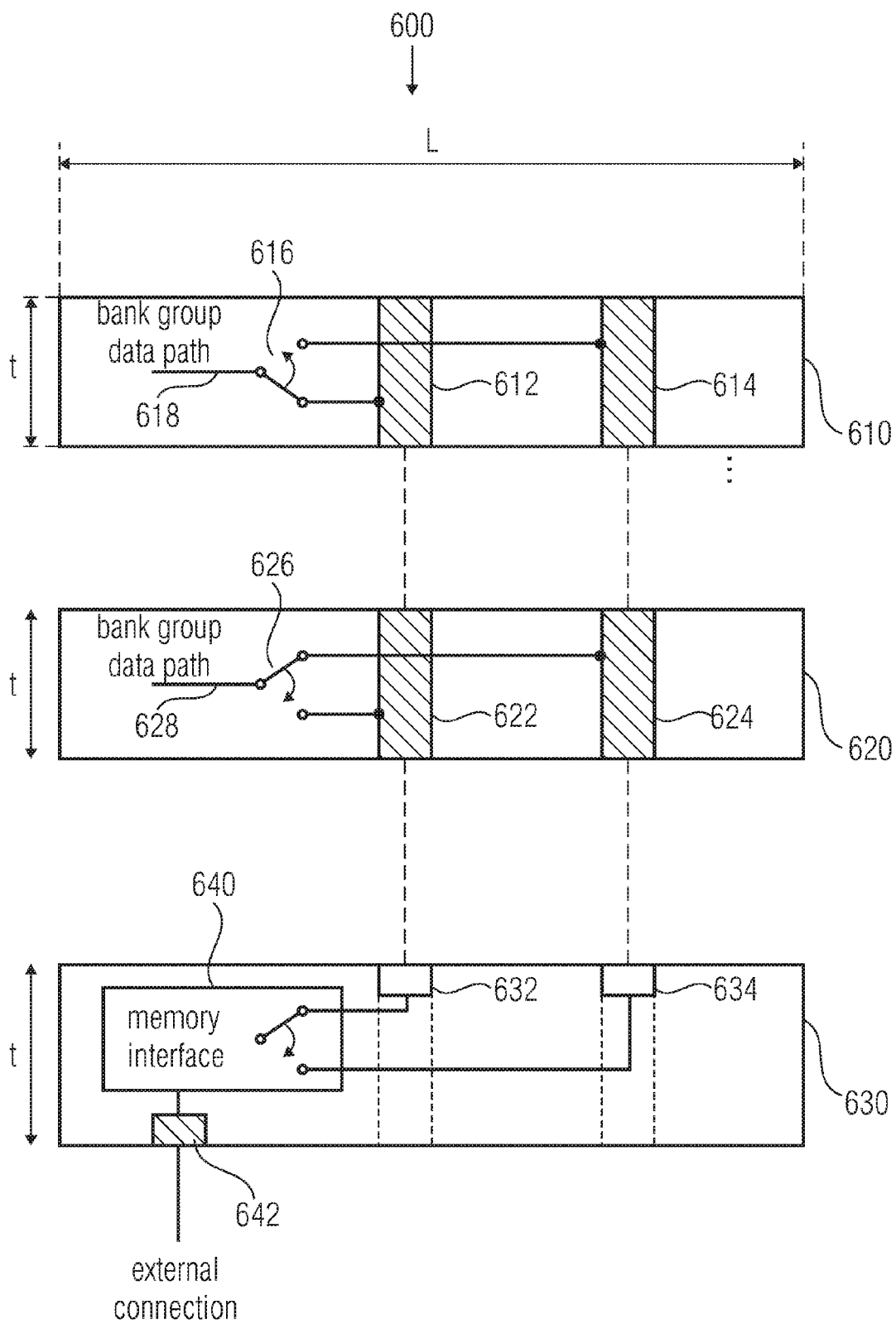
FIG. 6 shows an extract from a block schematic diagram of a multi-die memory, according to an embodiment.

Taking reference to FIG. 6, details regarding the structure of the inter-die data bus will be described in the following. FIG. 6 shows a block schematic diagram of a multi-die memory according to an embodiment according to the invention. The multi-die memory shown in FIG. 6 is designated in its entirety with 600. The multi-die memory 600 comprises, for example, at least three dice 610, 620, 630. The first die 610 may for example comprise the first through-silicon via 612 and a second through-silicon via 614. The first through-silicon via 612 may either represent a single through-silicon via or even a group of through-silicon vias being part of a first inter-die data bus 530. The second through-silicon via 614 may represent either a single through-silicon via or a group of through-silicon vias being part of a second inter-die data bus 532. Similarly, the second die 620 may comprise a first through-silicon via 622, which may in some embodiments according to the invention represent a group of through-silicon vias. Moreover, the second die 620 may comprise a second through-silicon via 624, which may in some embodiments according to the invention represent a group of through-silicon vias. The third die 630 may comprise a first contact 632, which may in some embodiments according to the invention represent a first group of contacts 632 being part of a first inter-die data bus 530. The third die 630 may further comprise a second contact 634, which may in some embodiments according to the invention represent a second group of contacts being part of the second inter-die data bus 532. However, in some embodiments according to the invention, the first contact 632 or the first group of contacts may be replaced by a first through-silicon via or a first group of through-silicon vias, respectively. Optionally, the second contact 634 or the second group of contacts may be replaced by a second through-silicon via or a second group of through-silicon vias, respectively.

In an embodiment according to the invention, the first die 610, the second die 620 and the third die 630 may be stacked. For example, the second die 620 may be arranged between the first die 610 and the third die 630. For example, the second die 620 may be sandwiched between the first die 610 and the third die 630. However, in some embodiments according to the invention, the first die 610 may be in direct contact with the second die 620, and the second die 620 may be in direct contact with the third die 630. However, in some other embodiments according to the invention, one or more spacer layers may be arranged between two adjacent dice.

Nevertheless, in some embodiments according to the invention, the dice 610, 620, 630 may be arranged such that the first through-silicon via 612 of the first die 610 is electrically connected to the first through-silicon via 622 of the second die. Similarly, the first through-silicon via 622 of the second die may be in electrical contact with the first contact 632 or the first through-silicon via of the third die. In an embodiment according to the invention, the second through-silicon via 614 of the first die is electrically connected with the second through-silicon via 624 of the second die 620. The second through-silicon via 624 of the second die 620 may be in an electrical contact with the second contact 634 or the second through-silicon via of the third die 630.

Thus, the first through-silicon via 612 of the first die 610, the first through-silicon via 622 of the second die 620 and the first contact 632 of the third die 630 may all be part of a signal line or signal path of the first inter-die data bus 530. Similarly, the second through-silicon via 614 of the first die 610, the second through-silicon via 624 of the second die 620 and the second contact 634 of the third die 630 may all be part of a signal line or a signal path of a second inter-die data bus 532. The first inter-die data bus 530 may be electrically isolated from the second inter-die data bus 532.

The first die 610 may comprise a selector or switch 616 for selectively coupling a bank-group-internal data path or die-internal data path 618 to the first through-silicon via 612 or to the second through-silicon via 614. The selector 616 may be implemented in many different ways. In a very simple embodiment according to the invention, there may be bond pads and a bond wire for implementing the selector 616. In other words, by placing a bond wire in one out of a plurality of possible positions, it may be selected to which out of the at least two through-silicon vias 612, 614 of the first die 610 the bank-group-internal data path 618 is connected. Alternatively, the selector 616 may be implemented in the form of an electronic circuit. For example, one or more transmission gates may be used to implement a configurable connection between the through-silicon vias 612, 614 and the bank-group-internal data path 618. In some embodiments, the position of the selector 616 may be configured in dependence on a volatile or non-volatile memory element, a state of which defines a state of the selector 616. In an alternative embodiment, the state of the selector 616 may for example be configured in an initialization sequence of the multi-die memory. To summarize, there are many possible options how to implement the functionality of the selector 616. Also, there are many different options how to set the state of the selector 616.

In the embodiment according to the invention shown in FIG. 6, the selector 616 is for example configured to connect the bank-group-internal data path 618 of the first die 610 to the first through-silicon via 612 of the first die 610. Thus, the bank-group-internal data path 618 may for example be coupled with the first die-to-die data path.

The second die 620 may comprise a corresponding selector 626, which may, for example, be configured to connect a bank-group-internal data path 628 of the second die 620 selectively with the first through-silicon via 622 or the second through-silicon via 624. It should be noted here that the functionality of the selector 626 of the second die 20 may be similar to the functionality of the selector 616 of the first die 610. Nevertheless, in an exemplarily embodiment, the selector 616 of the first die 610 and the selector 626 of the second die 620 may be configured such that the bank-group-internal data path 618 of the first die 610 is connected to a different die-to-die data bus than the bank-group-internal data path 628 of the second die 620.

It should be noted here that the first die 610 may comprise a similar internal structure compared to the die 400. For example, the first die 610 may comprise a plurality of memory banks connected to the bank-group-internal data path 618. Thus, the functionality of the bank-group-internal data path 618 of the first die 610 may be similar to the functionality of the bank-group-internal data path 314 described with reference to FIGS. 3 and 4. Nevertheless, in some embodiments according to the invention, the coupling circuit 316 shown in FIGS. 3 and 4 is replaced by the selector 616 in combination with the independent die-to-die data busses in the multi-die memory 600.

The third die 630 of the multi-die memory 600 comprises a memory interface 640. The memory interface may for example be circuited between, on the one hand, an external connection 642 of the multi-die memory 600 and, on the other hand, the first contact 632 (or first through-silicon via) of the third die 630 and the second contact 634 (or second through-silicon via) of the third die 630. In an embodiment according to the invention, the memory interface 640 may be configured to determine whether data (for example, address data, write data or control data) received from the external connection 642 are relevant for the bank group of the first die 610 or for the bank group of the second die 620. Thus, the memory interface 640 may for example be configured to route the data received from the external connection 642 either to the first contact 632 (i.e., to the first die-to-die data bus) or to the second contact 634 (i.e., to the second die-to-die data bus). Thus, the memory interface 640 may for example be configured to forward different data to the first die-to-die data bus and to the second die-to-die data bus. Thus, the first die-to-die data bus and the second die-to-die data bus may act as parallel and independent die-to-die data busses, to which different data may be applied at a given instance in time.

In some embodiments according to the invention, the memory interface 640 may also be configured to receive data provided by the bank groups of the first die 610 and the second die 620 via the independent die-to-die data busses. For example, a memory bank of the bank group of the first die 610 may provide data to the memory interface 640 via the first die-to-die data bus. A memory bank of the memory array of the second die 620 may provide data to the memory interface 640 by the second die-to-die data bus. In some embodiments according to the invention, the memory interface 640 may be configured to combine the data received via the first die-to-die data bus and via the second die-to-die data bus to provide these data to the external connection 642.

To summarize the above, according to some embodiments according to the invention, the multi-die memory 600 may be configured to allow for a data exchange between the memory interface 640 and different memory groups arranged on different dice via a plurality of parallel die-to-die data busses. According to some embodiments according to the invention, the parallel die-to-die data busses are routed in a direction which is approximately perpendicular to a main surface (e.g., a surface having a maximum area) of the dice. According to some embodiments, the die-to-die data busses comprise through-substrate vias or through-silicon vias. According to some embodiments according to the invention, the routing of the parallel die-to-die data busses in a direction approximately perpendicular to the main surfaces of the dice may result in a reduction of a die-size-contribution of the data busses connecting the individual bank groups to the memory interface. In some embodiments according to the invention, a thickness t of the dice 610, 620, 630 is substantially smaller (e.g., at least by a factor of 10 smaller) than a maximum lateral dimension L of the dice.

Figure 7A:
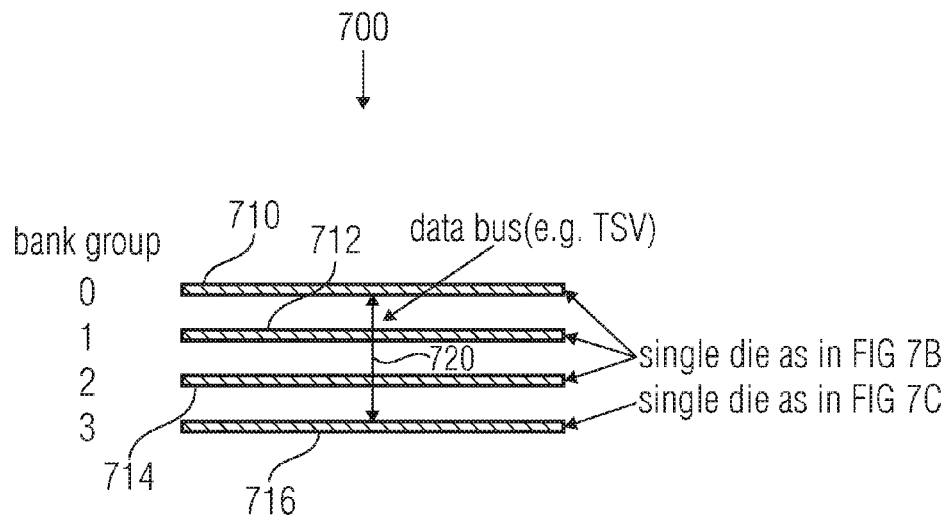
FIG. 7a shows a schematic cross-sectional representation of a multi-die memory, according to an embodiment.
Figure 7B:
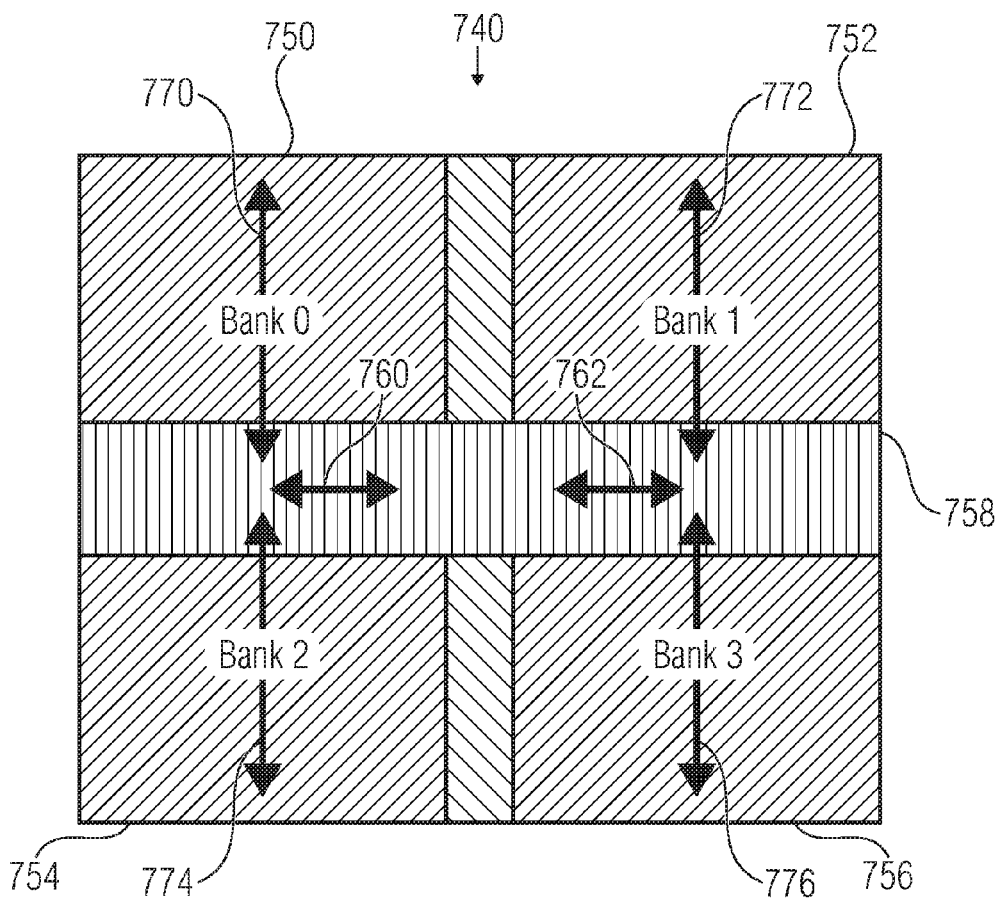
Figure 7C:
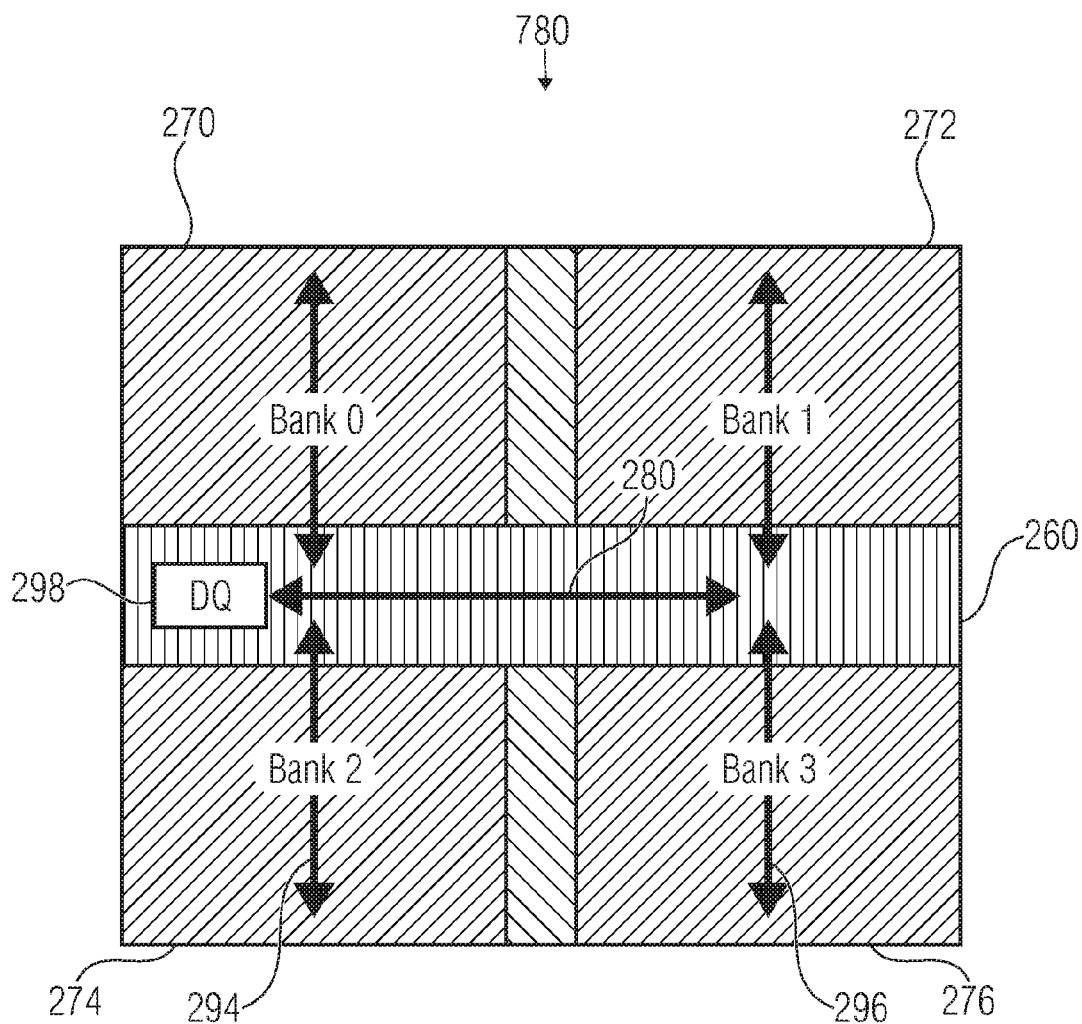

In the following, another embodiment according to the invention will be described making reference to FIGS. 7a, 7b and 7c. FIG. 7a shows a block schematic diagram of a multi-die memory, according to an embodiment according to the invention. The multi-die memory shown in FIG. 7a is designated in its entirety with 700.

The multi-die memory 700 comprises a first die 710, a second die 712, a third die 714 and a fourth die 716. The four dice 710, 712, 714, 716 may for example be stacked to form a stack of dice. In an embodiment according to the invention, the first die 710 may be a single die as shown in FIG. 7b. The second die 712 may also be a single die as shown in FIG. 7b, and the third die 714 may also be a single die as shown in FIG. 7b. The fourth die 716 may for example be a single die as shown in FIG. 7c.

In an embodiment according to the invention, the first die 710 may comprise a first bank group ("bank group 0"), the second die 712 may comprise a second bank group ("bank group 1"), the third die 714 may comprise a third bank group ("bank group 2"), and the fourth die 716 may comprise a fourth bank group ("bank group 3"). In an embodiment according to the invention, the multi-die memory 700 may comprise a data bus 720. The data bus 720, which may for example be considered as a die-to-die data bus or an inter-die data bus, may, for example, comprise the functionality of the data bus 220 described with reference to FIG. 2. In an alternative embodiment according to the invention, the die-to-die data bus 720 may comprise a functionality of the die-to-die data bus 520 and may therefore comprise a plurality of separate die-to-die data busses.

Taking reference to FIG. 7b, a possible configuration of the first die 710, the second die 712 and the third die 714 will be described. FIG. 7b shows a block schematic diagram of a die, which can be used in the multi-die memory 700 according to FIG. 7a. The die shown in FIG. 7b is designated in its entirety with 740. The die 740 comprises a first bank 750, a second bank 752, a third bank 754 and a fourth bank 756. The die 740 comprises a spine area 758, which may be arranged in a central region of the die 740. The die 740 further comprises spine data busses 760, 762 arranged within the spine region 758. The die 740 comprises a first bank data bus 770 configured to connect the first memory bank 750 to the first spine data bus 760. The die 740 comprises a second bank data bus 772 configured to connect the second bank 752 to the second spine data bus 762. The die 740 comprises a third bank data bus 774 configured to connect the third memory bank 754 with the first spine data bus 760. The die 740 comprises a fourth bank data bus 776 configured to connect the fourth memory bank 756 to the second spine data bus 762.

Thus, according to an embodiment according to the invention, the first bank 750 and the third bank 754 are coupled to the first spine data bus 760. The second bank 752 and the fourth bank 756 are coupled to the second spine data bus 762. It should be noted here that in some embodiments according to the invention, the first spine data bus 760 and the second spine data bus 762 may be die-internal data busses or bank-group-internal data busses. In some embodiments according to the invention, the first spine data bus 760 and the second spine data bus 762 may be coupled to the inter-die data bus 720 via a coupling circuit. In some embodiments according to the invention, a coupling circuit 316 as described with reference to FIG. 4 may be used. However, other types of coupling circuits may alternatively be used to couple spine data busses 760, 762 to the inter-die data bus 720. According to an embodiment according to the invention, a coupling circuit 616,626, as described with reference to FIGS. 5 and 6, may be used.

According to some other embodiments according to the invention, there is only a single spine data bus, to which the bank data busses 770, 772, 774, 776 are coupled.

According to some embodiments according to the invention, the die 740 does not comprise any interfaces to couple the memory banks 750, 752, 754, 756 to an external environment of the multi-die memory. In other words, according to some embodiments all of the interfaces on the die 740 are configured to couple the die 740 to other dice.

Taking reference to FIG. 7c, a die carrying the interface to the outside of the multi-die stack will be described. The die shown in FIG. 7c is designated in its entirety with 780. The die 780 may be very similar to the die 250 shown in FIG. 2b. Thus, identical means will be designated with identical reference numerals, and will not be explained again here. Rather, reference is taken to the description of the die 250 shown in FIG. 2b.

It should be noted here that in some embodiments according to the invention, the die 780 may be used as the fourth die 716 in the multi-die memory 700. In other words, in some embodiments according to the invention of a multi-die memory, there may be one or more dice 740, which do not comprise an external interface. Rather, these dice may only have an interface for coupling between different dice. Moreover, a multi-die memory may comprise at least one die having an external interface (e.g., the interface 298) for coupling the multi-die memory to an external environment, for example to an external environment outside of a package of the multi-die memory. In some embodiments according to the invention, the multi-die memory may therefore comprise at least one non-interface die and at least one interface die, wherein the at least one non-interface die differs from the at least one interface die in that an external interface circuitry, which is present in the interface die, is missing in the non-interface die.

To summarize the above, in some embodiments according to the invention described with reference to FIGS. 2a and 2b, and with reference to FIGS. 5a and 5b, identical dice can be used inside the stack (e.g., within the multi-die stack forming the multi-die memory). According to some embodiments according to the invention, identical dice may, for example, be configured differently according to a position in the stack. For example, the configuration of a die may be set in dependence on whether the die is a bottom die or not a bottom die. In some embodiments according to the invention, an external interface of the bottom die may be activated, while the external interface in the non-bottom dice is deactivated.

Some embodiments according to the invention described with reference to FIGS. 7a, 7b and 7c may comprise a different die for the bottom die (for example for the fourth die 716). According to some embodiments according to the invention, only the bottom die (for example, the fourth die 716) may carry an interface to outside the stack (while the other dice may, for example, not comprise any interface to outside the stack). According to some embodiments, such a configuration may allow to reduce a size of the upper dice (for example, of the first die 710, the second die 712 and the third die 714) in the stack.

Figure 8A:
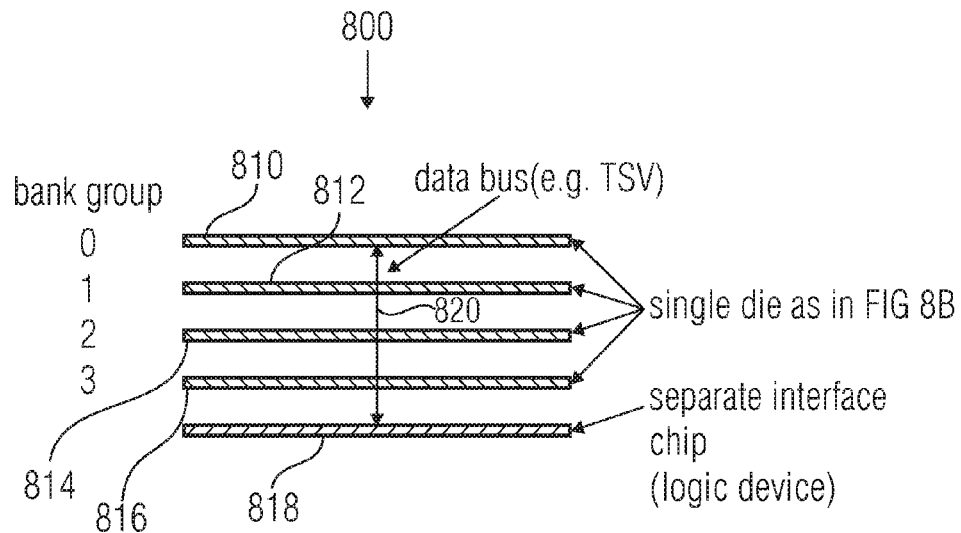
FIG. 8a shows a schematic cross-sectional representation of a multi-die memory, according to an embodiment.
Figure 8B:
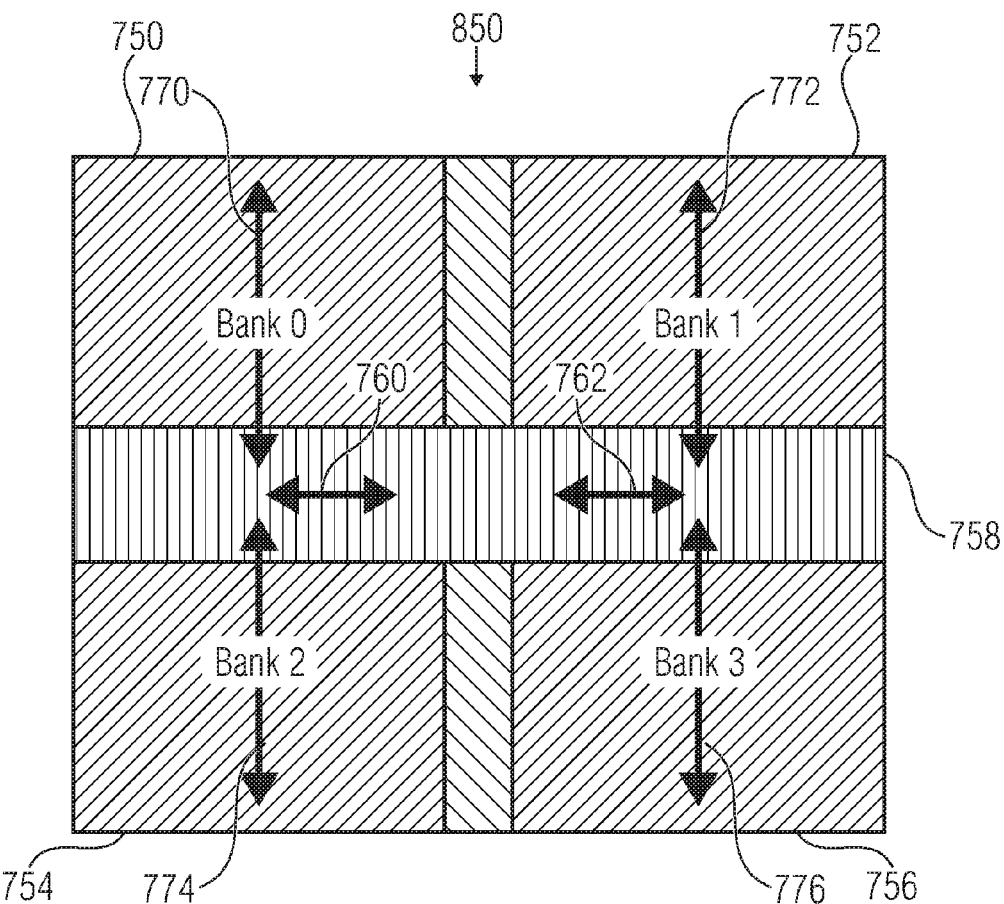

In the following, another embodiment according to the invention will be described taking reference to FIGS. 8a and 8b. FIG. 8a shows a schematic cross-sectional representation of a multi-die memory, according to an embodiment according to the invention. The multi-die memory shown in FIG. 8a is designated in its entirety with 800. The multi-die memory 800 comprises a plurality of memory dice 810, 812, 814, 816 and at least one interface die 818. The first memory die 810 may be a single die as shown in FIG. 8b, the second memory die 812 may be a single die as shown in FIG. 8b, the third die 814 may be a single die as shown in FIG. 8b, and the fourth memory die 816 may be a single die as shown in FIG. 8b. The first memory die 810 may for example comprise a first bank group ("bank group 0"), the second memory die 812 may comprise a second bank group ("bank group 1"), the third memory die 814 may comprise a third bank group ("bank group 2") and the fourth die 816 may comprise a fourth bank group ("bank group 3").

The interface die 818 may be a separate interface chip. In an embodiment according to the invention, the memory dice 810 to 816 may be coupled to the interface die 818 via an inter-die data bus or die-to-die data bus 820. The inter-die data bus 820 may, for example, comprise one or more through-silicon vias or through-substrate vias (TSV).

In an embodiment according to the invention, the interface die 818 may be a separate interface chip. In some embodiments according to the invention, the interface die 818 may comprise as an interface circuitry a logic device. The interface die 818 may be configured for providing an external interface for coupling the inter-die data bus 820 to an external environment of the multi-die memory.

In some embodiments according to the invention, the interface die 818 may be fabricated using a different chip fabrication technology when compared to the memory dice 810 to 816. For example, the interface die 818 may be fabricated using a chip fabrication technology optimized for logic devices. In contrast, according to some embodiments the memory dice 810 to 816 may be fabricated using a chip fabrication technology optimized for memory devices. Thus, the interface die 818 may have a different layer sequence when compared to the memory dice 810 to 816.

FIG. 8*b* shows a block schematic diagram of an exemplary memory die, which may be used in the multi-die memory 800 according to FIG. 8. The memory die shown in FIG. 8*b* is designated in its entirety with 850. The memory die 850 shown in FIG. 8*a* may be very similar to the memory die 740 shown in FIG. 7*b*. Therefore, identical means are designated with identical reference numerals in FIGS. 7*b* and 8*b*. With respect to other details, reference is made to the detailed description of the die 740 shown in FIG. 7*b*.

Some embodiments according to the invention of a multi-die memory 800 comprising a separate interface die 818 may bring along the possibility to implement higher interface speeds. For example, the interface die 818 may be suited better for implementing a fast interface than the memory dice 810 to 816. In some embodiments according to the invention, the usage of a separate interface die 818 may result in a lower power consumption. In some further embodiments according to the invention faster array cycle times may possibly be achieved by using the separate interface die 818.

Figure 9:
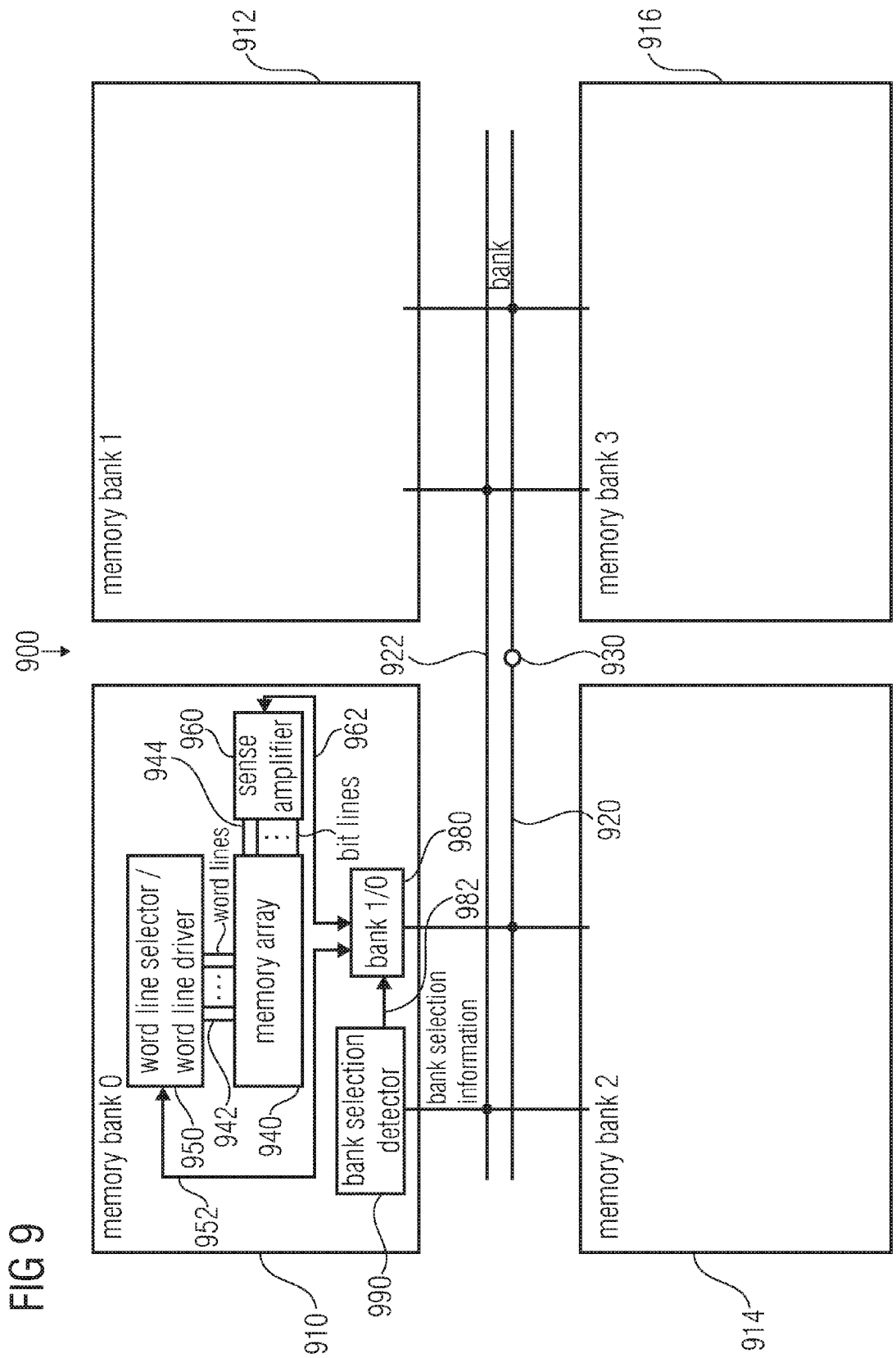
FIG. 9 shows an extract from a block schematic diagram of a bank group.

In the following, a bank group structure will be described taking reference to FIG. 9. FIG. 9 shows an extract of a block schematic diagram of a memory die, according to an embodiment according to the invention. A bank group arrangement shown in FIG. 9 is designated with its entirety with 900. The bank group arrangement 900 comprises a first memory bank 910, a second memory bank 912, a third memory bank 914 and a fourth memory bank 916. However, there are naturally alternative embodiments having more or less memory banks, for example two memory banks, four memory banks, eight memory banks or sixteen memory banks.

The bank group arrangement 900 comprises a bank-group-internal data bus 920, which may, for example, be configured to transport address data, read data, write data and/or control data. In addition, the bank group arrangement 900 may comprise a bank selection line or bus 922, which may, for example, be configured to transport a bank selection information.

In an embodiment according to the invention, the bank-group-internal data bus 920 is coupled to all of (or at least to a plurality of) the memory banks 910, 912, 914, 916 belonging to the group of memory banks. For example, the bank-group-internal data bus 920 may be configured to provide data to the individual memory banks 910 to 916 via shared lines. In other words, data intended for the first memory bank 910 may, for example, be applied to the same data lines of the bank-group-internal data bus 920 as data for the second memory bank 912.

The bank-group-internal data bus 920 may for example be coupled to a die-to-die data bus or to an inter-die data bus by a coupling circuit 930. It should be noted here that the bank-group-internal data bus 920 may for example be equivalent to the bank-group-internal data busses 314, 324, 334 described with reference to FIGS. 3 and 4. Moreover, the coupling circuit 930 may, for example, be equivalent to the coupling circuit 316 described with reference to FIGS. 3 and 4.

In the following, some details regarding the memory banks will be described. It should be noted here that details of the first memory bank 910 will be described subsequently. However, according to some embodiments according to the invention, the other memory banks, for example the second memory bank 912, the third memory bank 914 and the third memory bank 916, may have a very similar structure.

The first memory bank 910 may, for example, comprise a memory array 940 for storing data. The memory array 940 may for example comprise a matrix of DRAM cells. An array of DRAM cells or dynamic random access memory cells is well known to those skilled in the art. The memory array 940 may for example comprise a plurality 942 of word lines as well as a plurality 944 of bit lines. According to an embodiment according to the invention, the first memory bank 910 may comprise a word line selector/word line driver 950 for driving the word lines 942 of the memory array in dependence on a word line selection information 952. In an embodiment according to the invention, the first memory bank 910 comprises a sense amplifier 960, which may for example be coupled to bit lines 944 of the array 940. The sense amplifier 960 may for example be configured to amplify a potential present at the bit lines. The sense amplifier 960 may, for example, be configured to provide a read data information 962 indicating a state of DRAM memory cells of the memory array 940. The sense amplifier 960 may also be configured to refresh a content of the DRAM memory cells, for example, in response to an activation of a word line.

The sense amplifier 960 may also be configured to write data to the memory array 940.

The first memory bank 910 may further comprise a bank input/output circuit 980, which may, for example, be configured to control a data exchange between the first memory bank 910 and the bank-group-internal data bus 920. In an embodiment according to the invention, the bank input/output circuit 980 may be configured to receive a bank activation signal 982 from a bank selection detector 990. The bank selection detector 990 may, for example, be coupled to the bank selection bus 922 to receive the bank selection information. If the bank selection information provided by the bank selection bus 922 indicates that the first bank 910 should obtain data from the bank-group-internal data bus 920 or provide data to the bank-group-internal data bus 920, the bank selection detector 990 may, for example, provide the bank activation signal 982 to the bank input/output circuitry 980. After an activation of the bank activation signal 982, the bank input/output circuit 980 may, for example, forward data from the bank-group-internal data bus 920 to the word line selector/word line driver 950 and/or to the sense amplifier 960. Moreover, if the first bank 910 is activated for a read access, the bank input/output circuit 980 may for example provide data delivered by the sense amplifier 960 (or at least a selected portion thereof) to the bank-group-internal data bus 920.

Thus, several of the memory banks (for example the memory banks 910, 912, 914, 916) may share the bank-group-internal data bus 920.

Also, the memory banks 910, 912, 914, 916 may be configured such that a word line activated in the first memory bank 910 can be selected independently from a word line activated in the second memory bank 912. Thus, a high degree of parallelization can be achieved according to some embodiments according to the invention. Access times to the memory banks 910, 912, 914, 916 can be minimized for example by keeping world lines open in different memory banks. Also, a pipeline effect can for example be obtained by using several memory banks.

According to some embodiments according to the invention, an alignment of any kind of DRAM array stacks with a DRAM bank group structure can be obtained. Some embodiments according to the invention described herein can be used in a master-slave array stack. Some other embodiments according to the invention described herein can be used with an array stack with separate spine.

According to an aspect, some embodiments create a DRAM with internal sub-blocks which allow a faster access (a read or write of a memory cell) sequence if consecutive accesses are to different sub-blocks. According to an aspect, there are some embodiments according to the invention where sub-blocks are realized by single dice, which are assembled together in one package, and where the dice are electrically connected with one of the dice establishing the interface.

According to an aspect, there are some embodiments according to the invention where an interconnect between the dice is realized by through-silicon via (TSV).

According to an aspect, there are some embodiments according to the invention where in addition to the DRAM dice another die is added to the configuration which establishes the interface.

According to an aspect, some embodiments according to the invention provide a bank group aligned array stack.

According to another aspect, some embodiments according to the invention provide a method to allow cost-effective DRAM with high bandwidth without increasing a pre-fetch size by implementing an internal group structure based on stacking arrays with high speed interconnect.

According to some embodiments according to the invention, different bank groups of a DRAM are realized by the different stacks of several stacked DRAM dice. According to some embodiments according to the invention, data paths for each bank group may then be completely separated with exception of an interconnect between the stacks. According to some embodiments according to the invention, these interconnects may be short. According to some embodiments according to the invention, the interconnects are realized by high-speed capable solutions, for example using through-silicon vias. According to some embodiments according to the invention, this short bus will be able to run at a required higher speed. According to some embodiments according to the invention, it may be possible to extend a bank group concept to speed requirements of a next generation without any major die size adder.

According to an aspect, some embodiments according to the invention allow the production of a cost-effective DRAM with high bandwidth without increasing pre-fetched size. According to some embodiments according to the invention, an internal group structure is implemented based on stacked DRAM dice with high speed interconnect.

It should be noted here that the count of banks and bank groups described herein should be considered exemplary only. Naturally, a count of banks and bank groups may be different for different types of memories. For example, a count of banks and bank groups may be different for memory generations beyond DDR4. Thus, the numbers (for example the numbers of banks and bank groups) described herein should be considered as just an example.

To summarize the above, different embodiments according to the invention have been described herein. Some embodiments according to the invention allow the creation of a bank group aligned array stack. Nevertheless, it should be noted that the embodiments according to the invention described herein should not be considered as limiting the scope of the invention.

According to some embodiments, the die-to-die path is used interleaved by the single dice, which may be bank groups or which may form bank groups.

According to some embodiments, the different dice are operating interleaved and using a common bus, for example the die-to-die bus, and a common interface running on higher speed than the single dice.

What is claimed is:

1. A multi-die memory, comprising:
a first die comprising a first group of memory banks and a first common memory interface; and
a second die comprising a second group of memory banks and a second common memory interface;
wherein the first group of memory banks and the second group of memory banks are coupled to the first common memory interface and to the second common memory interface which are each configured to selectively couple the first group of memory banks and the second group of memory banks with an external connection, and wherein one of the first common memory interface and the second common memory interface is deactivated and the other of the first common memory interface and the second common memory interface operates to selectively couple the first group of memory banks and the second group of memory banks with the external connection; and
wherein the first die and the second die are arranged in a common package.

2. The multi-die memory according to claim 1, wherein the first die and the second die are stacked,
wherein the first common memory interface is deactivated, and
wherein the first group of memory banks is connected to the second common memory interface via a die-to-die connection which is at least approximately perpendicular to a main surface of the stacked dies.

3. The multi-die memory according to claim 1, wherein the multi-die memory is configured such that address lines of the first group of memory banks are separated from address lines of the second group of memory banks with the exception of an interconnection between the first die and the second die.

4. The multi-die memory according to claim 1, wherein the multi-die memory is configured such that data lines of the first group of memory banks are separated from data lines of the second group of memory banks with the exception of an interconnection between the first die and the second die,
wherein the interconnection is coupled to the data lines of the first group of memory banks and to the data lines of the second group of memory banks.

5. The multi-die memory according to claim 1, wherein the multi-die memory comprises a die-to-die data path,
wherein the first group of memory banks comprises a group-internal data path that is coupled to the die-to-die data path to receive data from the die-to-die data path or to provide data to the die-to-die data path;
wherein the second group of memory banks comprises a group-internal data path that is coupled to the die-to-die data path to receive data from the die-to-die data path or to provide data to the die-to-die data path;
wherein the die-to-die data path is configured to be shared at least by the first group of memory banks and the second group of memory banks; and
wherein the group-internal data path of the first group of memory banks and the group-internal data path of the second group of memory banks are configured such that a data path line of the group-internal data path of the first group of memory channels can represent a different data value than a data path line of the group-internal data path of the second group of memory channels coupled to a same data path line of the die-to-die data path.

6. The multi-die memory according to claim 5, wherein the group-internal spine data path of the first group of memory banks is parallel to the group-internal spine data path of the second group of memory banks; and
wherein the group-internal spine data path of the first group of memory banks is decoupled from the group-internal spine data path of the second group of memory banks to be capable of carrying different data than the group-internal spine data path of the second group of memory banks.

7. The multi-die memory according to claim 1, wherein the multi-die memory comprises a die-to-die data path;
   wherein the first group of memory banks comprises a group-internal data path which is coupled to the die-to-die data path to receive data from the die-to-die data path or to provide data to the die-to-die data path;
   wherein the second group of memory banks comprises a group-internal data path which is coupled to the die-to-die data path to receive data from the die-to-die data path or to provide data to the die-to-die data path;
   wherein the multi-die memory is configured such that the die-to-die data path carries on a shared data path line data for the first group of memory banks and data for a second group of memory banks; and
   wherein the multi-die memory is configured such that the group-internal data path of the first group of memory banks carries only data for the first group of memory banks.

8. The multi-die memory according to claim 5, wherein the die-to-die data path is configured to carry a higher data rate than the group-internal data path.

9. The multi-die memory according to claim 1, wherein the multi-die memory comprises a third die;
   wherein the third die comprises a third group of memory banks and a third common memory interface, and wherein the third common memory interface is deactivated in the third die;
   wherein the first die, the second die and the third die are assembled in the common package;
   wherein the first group of memory banks is coupled to the operative common memory interface via a first die-to-die connection;
   wherein the third group of memory banks is coupled to the operative common memory interface via a second die-to-die connection; and
   wherein the first die-to-die connection is separate from the second die-to-die connection.

10. The multi-die memory according to claim 9, wherein the operative common memory interface is configured to selectively drive data to the first die-to-die connection or to the second die-to-die connection in dependence on whether an access to the first group of memory banks or an access to the third group of memory banks is requested.

11. The multi-die memory according to claim 9, wherein the operative common memory interface is configured to selectively forward data from the first die-to-die connection or from the third die-to-die connection to the external connection.

12. The multi-die memory according to claim 1, wherein each group of memory banks comprises at least two memory banks;
   wherein different memory banks comprise separate memory arrays; and
   wherein each of the memory banks is configured such that word lines of memory arrays of different memory banks can be activated independently.

13. The multi-die memory according to claim 1, wherein the operative common memory interface is configured to interface the first group of memory banks and the second group of memory banks to the external connection such that external electrical characteristics of the multi-die memory match external electrical characteristics of a single die memory comprising a plurality of groups of memory banks arranged on a single die.

* * * * *